United States Patent [19]

Arimura et al.

[11] Patent Number: 5,532,094
[45] Date of Patent: Jul. 2, 1996

[54] COMPOSITION FOR TREATING COPPER OR COPPER ALLOY SURFACES

[75] Inventors: Maki Arimura; Daisaku Akiyama; Toshiko Nakagawa, all of Amagasaki, Japan

[73] Assignee: MEC Co., Ltd., Amagasaki, Japan

[21] Appl. No.: 394,809

[22] Filed: Feb. 27, 1995

[30] Foreign Application Priority Data

Mar. 4, 1994 [JP] Japan .................................. 6-034005
Aug. 25, 1994 [JP] Japan .................................. 6-200459

[51] Int. Cl.$^6$ ............................................. C09K 13/00
[52] U.S. Cl. ................... 252/79.1; 252/79.4; 134/3; 134/41; 156/625.1; 156/634.1; 156/654.1; 156/655.1; 156/656.1
[58] Field of Search .................................. 252/146, 148, 252/173, 390, 79.1, 79.4; 134/3, 41; 422/7, 12, 17, 19; 156/625.1, 634.1, 654.1, 655.1, 656.1

[56] References Cited

U.S. PATENT DOCUMENTS 3,933,531  1/1976  Sawa et al. ............................ 252/390

FOREIGN PATENT DOCUMENTS

| 0364132 | 4/1990 | European Pat. Off. . |
| 0428260 | 5/1991 | European Pat. Off. . |
| 0428383 | 5/1991 | European Pat. Off. . |
| 0551112 | 7/1993 | European Pat. Off. . |
| 0627499 | 12/1994 | European Pat. Off. . |
| 4-173983 | 6/1992 | Japan . |
| 4-183874 | 6/1992 | Japan . |
| 5-93281 | 4/1993 | Japan . |
| 5-230674 | 9/1993 | Japan . |

OTHER PUBLICATIONS

Metal Finishing, vol. 83, No. 1, Jan. 1985, M. Bakszt, "Providing Solderability Retention By Means Of Chemical Inhibitors".

*Primary Examiner*—Hoa Van Le
*Attorney, Agent, or Firm*—Oblon, Spivak, McClelland, Maier & Neustadt

[57] ABSTRACT

A method for roughening surfaces of copper or copper alloy to provide an excellent adhesion of a coated or laminated layer thereon, comprising treating said surfaces with an amount and for a time effective to roughen them with an aqueous solution comprising an azole compound, a copper compound dissolvable in the solution, an organic or inorganic acid and a halogen ion.

6 Claims, No Drawings

5,532,094

COMPOSITION FOR TREATING COPPER OR COPPER ALLOY SURFACES

BACKGROUND OF THE INVENTION

Field of the Invention

The present invention relates to a surface treating composition for copper or copper alloy which is useful for toughening the copper or copper alloy surfaces.

DESCRIPTION OF THE BACKGROUND ART

In the manufacture of printed-wiring boards, copper surfaces are roughened in order to improve adhesion of etching resists or solder resists to be coated on the copper surfaces. Mechanical cleaning using a buffing or scrubbing machine or chemical cleaning, called microetching, are used for roughening copper surfaces. The chemical cleaning is more popular for treating substrates with fine line patterns.

The chemical cleaning is also used for improving solderability, for example, as a pretreatment for a solder coating step or for removing oxides from copper surfaces before soldering electronic parts. An aqueous solution comprising sulfuric acid and hydrogen peroxide as major components or an aqueous solution comprising a persulfate as a major component are commonly used for the chemical cleaning.

Along with high integration of circuit patterns formed on printed-wiring boards, the types of solder resists used are shifting from the conventional thermoset type to the UV curable type which is more excellent in forming fine line patterns. Because UV curable type solder resists are inferior in their adhesion properties to copper surfaces as compared with conventional solder resists, adhesiveness of the surfaces produced using these solder resists is insufficient. There are occasions where resist coatings come off or swell during the subsequent plating step, solder coating step, or electronic parts soldering step.

Furthermore, conventional micro-etchants cannot provide surfaces with sufficient solderability which is applicable to solder coating of printed-wiring boards with an increased number of pads for soldering parts thereon. There are a number of cases where soldering fails to adequately fix the electronic parts.

The object of the present invention is therefore to provide a surface treating composition for copper and copper alloys which can exhibit excellent adhesiveness to solder resists and the like and provide roughened surfaces of copper or copper alloys with adequate irregularities with deep convexes and concaves and superior solderability.

The present inventors have conducted extensive studies in order to achieve this object and found that a composition comprising an azole compound, a copper compound which is dissolved in this composition (hereinafter referred to as a dissolvable copper compound), an organic or inorganic acid, and a halogen ion, especially a composition comprising a cupric azole complex, an organic acid, and a halogen ion, can achieve this object.

SUMMARY OF THE INVENTION

Accordingly, an object of the present invention is to provide a composition for treating surfaces of copper or copper alloy which is an aqueous solution comprising: an azole compound, a dissolvable copper compound, an organic or inorganic acid, and a halogen ion.

In a preferred embodiment of the present invention, said composition comprises 0.1–15% by weight of an azole compound, 0.1–5% by weight of a dissolvable copper compound as copper metal, 0.1–30% by weight of an organic or inorganic acid, and 0.01–20% by weight of a halogen ion.

In another preferred embodiment, a copper azole complex is used as said azole compound and said dissolvable copper compound.

In still another preferred embodiment, said a copper azole complex is a cupric azole complex.

Other objects, features and advantages of the invention will hereinafter become more readily apparent from the following description.

DETAILED DESCRIPTION OF THE INVENTION AND PREFERRED EMBODIMENTS

The combined use of an azole compound and a dissolvable copper compound as essential components ensures the composition of the present invention to exhibit an appropriate etching rate for surface treatments. In the composition of the present invention, the dissolvable copper compound forms a copper complex, such as a cupric complex, with an azole compound, for example.

Included in the azole compounds which can be used in the present invention are diazoles, triazoles, tetrazoles, and their derivatives. Of these, particularly preferred from the viewpoint of the costs are imidazole, 2-methylimidazole, 2-ethylimidazole, 2-ethyl-4-methylimidazole, 2-phenylimidazole, 2-undecylimidazole, benzimidazole, and the like.

Specific examples of the dissolvable copper compound are copper hydroxide and copper salts of an acid, which are hereinafter mentioned.

Regarding the amounts of the azole compound and the dissolvable copper compound in the composition of the present invention, an amount of 1–15% by weight (hereinafter referred to simply as %), in terms of a cupric complex of an azole compound, is preferable in view of solubility and stability. As an azole compound, an amount of 0.1–15% is preferable; and as a copper compound, 0.1–5% (as metal) is preferable.

The azole compound and the dissolvable copper compound may be added separately, or they may be added as a copper complex, e. g. a cupric complex, of an azole compound. When a cupric complex of an azole compound is used, copper hydroxide or a copper salt of an acid may be preferably used as the cupric ion source for producing such a cupric complex of an azole compound.

The organic acids or inorganic acids are added to the composition of the present invention for adjusting pH and for dissolving copper produced by oxidation with the cupric complex of an azole compound or the like. Given as specific examples of the organic acids are saturated aliphatic acids, such as formic acid, acetic acid, propionic acid, n-butyric acid, n-valeric acid, and caproic acid; unsaturated aliphatic acids, such as acrylic acid, crotonic acid, and iso-crotonic acid; saturated aliphatic dicarboxylic acids, such as oxalic acid, malonic acid, succinic acid, glutaric acid, adipic acid, and pimelic acid; unsaturated aliphatic dicarboxylic acids such as maleic acid; aromatic carboxylic acids, such as benzoic acid, phthalic acid, and cinnamic acid; hydroxy carboxylic acids, such as glycolic acid, lactic acid, malic acid, and citric acid; carboxylic acids with substituents, such as sulfamic acid, β-chloroproplonic acid, nicotinic acid, ascorbic acid, hydroxy pivalic acid, and levulinic acid; as well as their derivatives. Specific examples of the inorganic acid include hydrochloric acid, sulfuric acid, nitric acid, and phosphoric acid.

These acids also can be the source for formig said copper salts used as the dissolvable copper compound.

The amount of the organic or inorganic acids in the composition of the present invention is preferably in the range of 0.1–30%. If this amount is too small, the composition cannot sufficiently dissolve oxidized copper and it is difficult to obtain active copper surfaces; it is too large, dissolving stability of copper is lowered.

Halogen ion is used in the composition of the present invention for increasing solubility of copper and oxidizing capability of the azole compounds, thereby ensuring production of copper surfaces with superior adhesiveness and solderability. Fluoride ion, chloride ion, bromide ion, or the like may be used as the halogen ion. These are added to the composition as a compound which can be dissociated in a solution. Such a compound may be an acid, such as hydrochloric acid or hydrobromic acid; a salt, such as sodium chloride, calcium chloride, potassium chloride, ammonium chloride, or potassium bromide; or a metal salt, such as copper chloride, zinc chloride, iron chloride, or tin bromide.

The amount of the halogen ion in the composition of the present invention is preferably in the range of 0.01–20%. If this amount is too small, it is difficult to obtain copper surfaces with excellent adhesiveness and solderability; if it is too large, dissolving stability of copper is lowered.

The pH of the surface treating composition of the present invention is in the range of less than 1 to about 8 depending on the kinds of organic or inorganic acids and other additives. In order to reduce fluctuation of pH during the use, a salt of organic acid, such as a sodium, potassium or ammonium salt of organic acid, may be added.

Other additives which may be added besides the above components include a complexing agent for improving dissolving stability of copper, such as ethylenediamine, pyridine, aniline, ammonia, monoethanolamine, diethanolamine, triethanolamine, and N-methyldiethanolamine; and other various additives for producing copper surfaces with excellent adhesiveness and solderability.

The surface treating composition can be prepared by adding the above-mentioned components, at proportions described above, to water and blending the mixture. There are no specific limitations to the method of addition. The components may be added either all at one time or separately in any arbitrary order. Ion-exchanged water is preferably used as the water.

There are no specific limitations to the method of using the surface treating composition of the present invention. Examples of such method include a method of spraying the composition to the surfaces of copper or copper alloy to be treated, a method of immersing the copper or copper alloy in the composition, and the like. If necessary, air may be bubbled to oxidize cuprous ion which has formed in the composition by etching of the copper or copper alloy into to cuptic ion.

In order to further improve adhesiveness between the copper or copper alloy surface and a resin, it is possible to further treat the surfaces treated with the composition of the present invention with an aqueous solution of an azole compound or an alcoholic solution according, for example, to U.S. Pat. No. 3,645,772.

The surface treating composition of the present invention can be widely used for chemical cleaning or the like of copper or copper alloys. The resulting surfaces of copper or copper alloy have adequate irregularities with deep convexes and concaves so that they can exhibit not only excellent adhesion to resins, such as prepregs, solder resists, dry film resists, and electrodeposition resists, but also superior solderability. Because of this, the surface treating composition is particularly useful for the manufacture of various printed-wiring boards, including those for pin grid array (PGA) or ball grid array (BGA), as well as for the surface treatment of lead frames used for integrated circuit boards.

For example, in the manufacture of copper-clad laminates for printed-wiring boards, surfaces exhibiting excellent adhesion to prepregs and superior etching performance in the patterning operation can be produced by roughening copper foils using the surface treating composition of the present invention. Further, in the manufacture of multi-layered printed-wiring boards, the use of the composition for roughening copper surfaces of inner layers produces surfaces which exhibit not only excellent adhesion to prepregs, but also a superb effect of preventing formation of pink rings. Because the surfaces treated with the composition of the present invention are less glossy than the surfaces treated with conventional sulfuric acid-hydrogen peroxide etchants, it has an effect, in addition to the increased adhesion to resins, that diffusion of light during irradiation is small and resolution of photosensitive resins is thereby increased, when the photosensitive resins are coated or laminated.

Other features of the invention will become apparent in the course of the following description of the exemplary embodiments which are given for illustration of the invention and are not intended to be limiting thereof.

EXAMPLES

Examples 1–4

Surface treating compositions were prepared by mixing the components listed in Table 1, and sprayed over copper-clad laminates for printed-wiring boards (.FR-4) at 40° C. for 60 seconds. A solder resist, PSR-4000 (trademark, manufactured by Taiyo Ink Co., Ltd.), was coated on the treated surfaces, irradiated, developed, and post-cured, thus producing various patterns. Then, a no-clean type solder flux, AP-4626 (trademark, manufactured by MEC Co., Ltd.), was coated and soldering was carried out using an automatic wave soldering machine. The conditions of the solder resist was then observed. In this experiment, in order to make the solder resist easier to come off a shorter post-cure time than the standard time period for solder resists was employed using the solder flux with a concentration three times as high as the standard concentration. The results are shown in Table 2.

Furthermore, copper-clad laminates for printed-wiring boards (FR-4), having a number of circular pads with a diameter of 1 mm and coated with the solder resist all over the area other than the circular pads, were spray-treated with the composition at 40° C. for 60 seconds . After coating a flux for solder coating, W-2556 (trademark, manufactured by MEC Co., Ltd.), soldering was carried out using a horizontal hot-air solder leveling machine. The rate of successful soldering (the proportion of the pads to which the solder coated) was examined. The results are shown in Table 2.

Comparative Examples 1–3

Surface treating compositions shown Table 1 were prepared and evaluated in the same manner as in Examples 1–4.

The results are shown in Table 2.

TABLE 1

| Examples 1 | Cupric complex of imidazole | 10% |
| | Glycolic acid | 7% |
| | Potassium chloride | 5% |
| | Ion-exchanged water | Balance |
| Examples 2 | Cupric complex of 2-methylimidazole | 5% |
| | Glutaric acid | 15% |
| | Zinc bromide | 1% |
| | Ethylenediamine | 0.2% |
| | Ion-exchanged water | Balance |
| Examples 3 | Cupric complex of imidazole | 15% |
| | Sulfamic acid | 3% |
| | Ammonium chloride | 10% |
| | Ion-exchanged water | Balance |
| Examples 4 | Cupric complex of 2-methylimidazole | 7% |
| | Acrylic acid | 20% |
| | Copper chloride | 1% |
| | Ion-exchanged water | Balance |
| Comparative Example 1 | Sulfuric acid | 10% |
| | 35% hydrogen peroxide solution | 5% |
| | Ion-exchanged water | Balance |
| Comparative Example 2 | Sodium persulfate | 10% |
| | Sulfuric acid | 1% |
| | Ion-exchanged water | Balance |
| Comparative Example 3 | Sodium persulfate | 10% |
| | Sulfuric acid | 1% |
| | Benztriazole | 1% |
| | Ion-exchanged water | Balance |

TABLE 2

| | Successful soldering (%) | Come-off/swelling of solder resist |
|---|---|---|
| Example 1 | 100 | None |
| Example 2 | 98.6 | None |
| Example 3 | 99.7 | None |
| Example 4 | 97.8 | None |
| Comparative Example 1 | 57.8 | Produced |
| Comparative Example 2 | 54.1 | Produced |
| Comparative Example 3 | 54.0 | Produced |

Examples 5–8

Surface treating compositions shown Table 3 were prepared and evaluated in the same manner as in Examples 1–4. The results are shown in Table 4.

TABLE 3

| Examples 5 | Imidazole | 3% |
| | Copper nitrate | 5% |
| | Nitric acid | 2% |
| | Iron chloride | 2% |
| | Ammonium nitrate | 8% |
| | Ion-exchanged water | Balance |
| Examples 6 | 1,2,4-Triazole | 8% |
| | Copper chloride | 6% |
| | Formic acid | 10% |
| | Ammonium formate | 10% |
| | Ion-exchanged water | Balance |
| Examples 7 | 2,5-Aminotetrazole | 1% |
| | Copper acetate | 5% |
| | Ammonium chloride | 3% |
| | Acetic acid | 2% |
| | Ion-exchanged water | Balance |
| Examples 8 | 4-Methylimidazole | 8% |
| | Copper oxide | 6% |
| | Hydrochloric acid | 3% |
| | Sodium chloride | 0.1% |
| | Ion-exchanged water | Balance |

TABLE 4

| | Successful soldering (%) | Come-off/swelling of solder resist |
|---|---|---|
| Example 5 | 98.3 | None |
| Example 6 | 95.8 | None |
| Example 7 | 97.0 | None |
| Example 8 | 99.5 | None |

Surfaces of copper or copper alloys having excellent adhesion to resins such as prepregs and resists and exhibiting superior solderability can be produced by treating these surfaces with the surface treating composition of the present invention. Because the resulting surfaces are less glossy than the surfaces produced by conventional chemical cleaning techniques, the composition of the present invention has an effect of improving resolution when the treated surfaces are used as a base for photosensitive resins. It also brings about an effect of reducing malfunctions in inspections of printed-wiring board circuits by an automatic optical inspection machine (AOI). The composition of the present invention therefore is an ideal surface treating agent for the manufacture of printed-wiring boards which are more and more miniaturized in their fine line patterns and highly integrated.

Obviously, numerous modifications and variations of the present invention are possible in light of the above teachings. It is therefore to be understood that within the scope of the appended claims, the invention may be practiced otherwise than as specifically described herein.

What is claimed is:

1. A method for roughening surfaces of copper or copper alloy to provide an excellent adhesion of a coated or laminated layer thereon, comprising treating said surfaces with an amount and for a time effective to roughen them with an aqueous solution comprising: an azole compound, a copper compound dissolvable in the solution, an organic or inorganic acid and a halogen ion.

2. A method for roughening surfaces of copper or copper alloy to provide an excellent adhesion of a coated or laminated layer thereon, comprising treating said surfaces with an amount and for a time effective to roughen them with an aqueous solution comprising: a cupric azole complex, an organic acid and a halogen ion.

3. A method for roughening surfaces of copper or copper alloy to provide an excellent adhesion of a coated or laminated layer thereon, comprising treating said surfaces with an amount and for a time effective to roughen them with an aqueous solution comprising: 1–15% by weight of a cupric azole complex, 0.1–30% by weight of an organic acid and 0.01–20% by weight of a halogen atom.

4. The method according to claim 1, wherein the content of said azole compound is 0.1–15% by weight; said dissolvable copper compound, 0.1–5% by weight as copper metal; said organic or inorganic acid, 0.1–30% by weight; and said halogen ion, 0.01–20% by weight.

5. The method according to claim 1, wherein a copper azole complex is used as said azole compound and said dissolvable copper compound.

6. The method according to claim 1, wherein said copper azole complex is a cuptic azole complex.

* * * * *